United States Patent
Sidhu et al.

(10) Patent No.: US 9,024,453 B2
(45) Date of Patent: May 5, 2015

(54) FUNCTIONAL MATERIAL SYSTEMS AND PROCESSES FOR PACKAGE-LEVEL INTERCONNECTS

(75) Inventors: Rajen S. Sidhu, Chandler, AZ (US); Ashay A. Dani, Chandler, AZ (US); Martha A. Dudek, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/976,192

(22) PCT Filed: Mar. 29, 2012

(86) PCT No.: PCT/US2012/031289
§ 371 (c)(1),
(2), (4) Date: Jun. 26, 2013

(87) PCT Pub. No.: WO2013/147808
PCT Pub. Date: Oct. 3, 2013

(65) Prior Publication Data
US 2014/0225265 A1 Aug. 14, 2014

(51) Int. Cl.
*H01L 23/48* (2006.01)
*H01L 23/532* (2006.01)
(Continued)

(52) U.S. Cl.
CPC ... *H01L 23/53209* (2013.01); *H01L 2224/1308* (2013.01); *H01L 2224/11005* (2013.01);
(Continued)

(58) Field of Classification Search
CPC .................................................. H01L 23/488
USPC ......................................................... 257/780
See application file for complete search history.

(56) References Cited

U.S. PATENT DOCUMENTS 5,461,261 A * 10/1995 Nishiguchi .................... 257/781
5,466,972 A * 11/1995 Frank et al. .................... 257/764
(Continued)

FOREIGN PATENT DOCUMENTS

| | | | |
|---|---|---|---|
| JP | 07-307538 A | 11/1995 | |
| WO | WO 97/41594 | * 6/1997 | ............. H01L 23/48 |
| WO | WO 97-41594 A1 | 11/1997 | |

OTHER PUBLICATIONS

International Search Report and Written Opinion mailed Nov. 28, 2012 for PCT/US2012/031289 filed Mar. 29, 2012, 13 pages.
(Continued)

*Primary Examiner* — Roy Potter
*Assistant Examiner* — Paul Patton
(74) *Attorney, Agent, or Firm* — Blakely, Sokoloff, Taylor & Zafman LLP

(57) ABSTRACT

Interconnect packaging technology for direct-chip-attach, package-on-package, or first level and second level interconnect stack-ups with reduced Z-heights relative to ball technology. In embodiments, single or multi-layered interconnect structures are deposited in a manner that permits either or both of the electrical and mechanical properties of specific interconnects within a package to be tailored, for example based on function. Functional package interconnects may vary one of more of at least material layer composition, layer thickness, number of layers, or a number of materials to achieve a particular function, for example based on an application of the component(s) interconnected or an application of the assembly as a whole. In embodiments, parameters of the multi-layered laminated structures are varied dependent on the interconnect location within an area of a substrate, for example with structures having higher ductility at interconnect locations subject to higher stress.

30 Claims, 8 Drawing Sheets

(51) Int. Cl.
*H01L 23/00* (2006.01)
*H01L 21/768* (2006.01)

(52) U.S. Cl.
CPC ........... *H01L24/11* (2013.01); *H01L 24/13* (2013.01); *H01L 24/14* (2013.01); *H01L 24/16* (2013.01); *H01L 24/81* (2013.01); *H01L 2224/1132* (2013.01); *H01L 2224/1145* (2013.01); *H01L 2224/11901* (2013.01); *H01L 2224/13111* (2013.01); *H01L 2224/13139* (2013.01); *H01L 2224/13147* (2013.01); *H01L 2224/13155* (2013.01); *H01L 2224/14505* (2013.01); *H01L 2224/16507* (2013.01); *H01L 2224/81191* (2013.01); *H01L 2224/8181* (2013.01); *H01L 2224/81815* (2013.01); *H01L 2224/16145* (2013.01); *H01L 2224/16227* (2013.01); *H01L 2924/3511* (2013.01); *H01L 21/76882* (2013.01)

(56) References Cited

U.S. PATENT DOCUMENTS

| | | | | |
|---|---|---|---|---|
| 7,786,599 | B2 * | 8/2010 | Amagai | 257/779 |
| 2009/0108443 | A1 * | 4/2009 | Jiang | 257/737 |
| 2010/0032840 | A1 | 2/2010 | Amagai | |
| 2012/0038045 | A1 * | 2/2012 | Lee | 257/738 |

OTHER PUBLICATIONS

International Preliminary Report on Patentability for corresponding International Application No. PCT/US2012/031289, mailing date Oct. 9, 2014, 10 pages.

* cited by examiner

FUNCTIONAL MATERIAL SYSTEMS AND PROCESSES FOR PACKAGE-LEVEL INTERCONNECTS

CROSS-REFERENCE TO RELATED APPLICATION

This application is a U.S. National Phase application under 35 U.S.C. §371 of International Application No. PCT/US2012/031289, filed Mar. 29, 2012, entitled FUNCTIONAL MATERIAL SYSTEMS AND PROCESSES FOR PACKAGE-LEVEL INTERCONNECTS.

TECHNICAL FIELD

Embodiments of the invention generally relate to integrated electronic device packaging, and more specifically pertain to interconnects between two substrates.

BACKGROUND

Packaging of integrated electronic devices, such as integrated circuits (ICs), Micro-Electro-Mechanical Systems (MEMs), Optical ICs (OICs), and the like often entails a bumping process during which solder bumps or copper (Cu) bumps are applied to a substrate that is to be joined to another substrate as a mounting interface to the external world. For example, FIG. 1A illustrates a chip substrate 105 with bumps 101 applied over pads 104 through solder resist 106. In the case of a ball grid array (BGA) technique or the related solder grid array (SGA) technique, the bumps 101 may be predominantly of copper (Cu) or any conventional solder alloy, such as Sn—Ag—Cu (SAC). As further illustrated in FIG. 1B, the chip substrate 105 is attached with the bumps 101 contacting receptacle pads 114 on a second substrate 110, which may be another chip, a package substrate, or the like. The bumps 101 are then reflowed to form an assembly 100 having conductive first level interconnects (FLI) between the two substrates 105 and 110. The bumping process may be further utilized as a second level interconnect (SLI) with bumps 102 interconnecting the substrate 110 to the substrate 120, as might be done for mounting a package to a PCB, for example.

Problems with the interconnect technology illustrated by FIGS. 1A and 1B include solder joint reliability (SJR) failures and interlayer dielectric (ILD) cracking within one or more of the substrates due to high stress concentrations, for example due to mismatch in coefficient of thermal expansion (CTE) between the substrates 105, 110, and/or 120. Recent developments in bulk solder composition for FLI and SLI have achieved only marginal reductions in stress with stiffness of copper bumps remaining. Costly architectures therefore continue to be employed to reduce stress, for example with a plurality of non-critical to function (nCTF) joints disposed at particular locations across a bumped substrate face. Another problem with the interconnect technology illustrated by FIGS. 1A and 1B is further illustrated in FIG. 1C with a plan view of the bumped face of the chip substrate 105. As shown, conventionally all bumps 101 have approximately the same dimension and a same composition so that the interconnect is independent of the function and/or location of a particular joint.

FLI and SLI structures offering lower stress and/or the prospect of functional alloying are therefore advantageous, as are the technologies associated with fabrication of such structures.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1A:
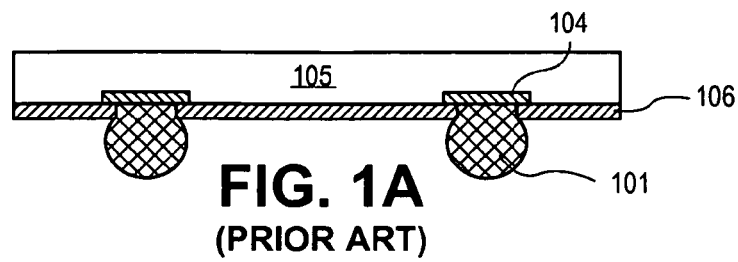
FIG. 1A is a cross-sectional view of a conventionally bumped chip substrate.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause and effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Described herein are embodiments of interconnect packaging technology that allows for direct-chip-attach for through-substrate-vias (TSV), package-on-package, or FLI and SLI interconnect stack-ups with reduced Z-heights. In embodiments, either or both of the electrical and mechanical properties of specific interconnects within a package are tailored, for example based on function. Generally, the functional package interconnect technology embodiments described herein vary one or more material layer composition, layer thicknesses, number of layers, or number of materials to achieve a particular function for a given interconnect. Parameters of the interconnect affecting function may for example be varied based on an application of the component(s) interconnected or application of the assembly. In further embodiments, material parameters of interconnects are varied with respect to the interconnect location across an area of a substrate, for example to provide structures having higher ductility at interconnect locations subject to higher stress.

Figure 1B:
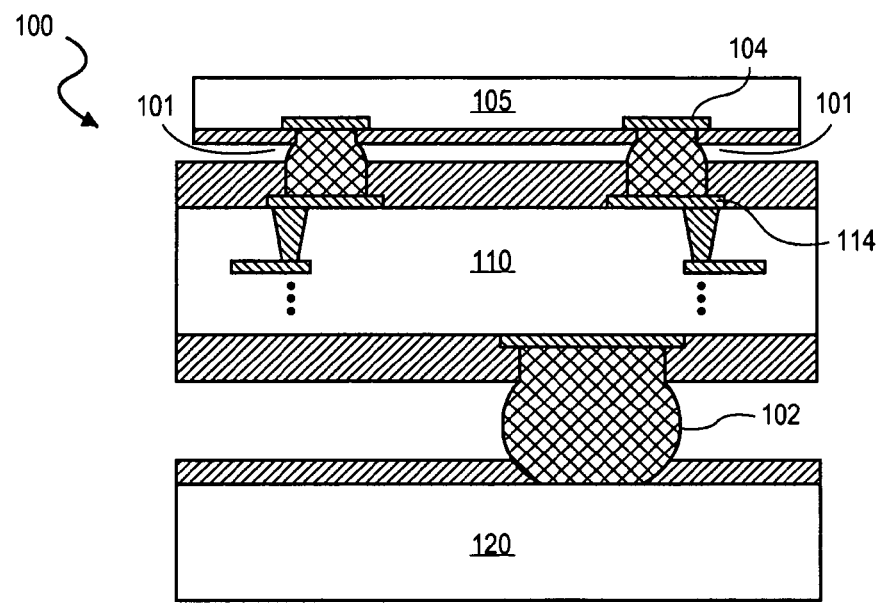
FIG. 1B is a cross-sectional view of a package assembly employing conventional BGA or SGA technology.
Figure 1C:
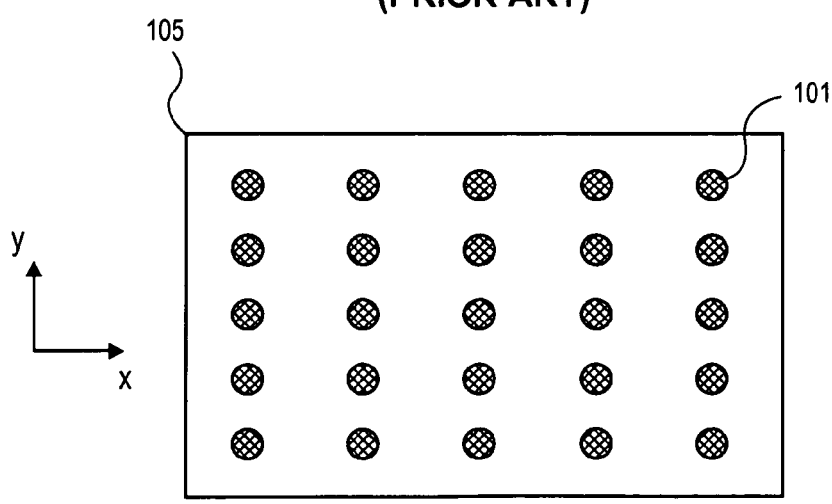
FIG. 1C is a plan view of a conventionally bumped chip substrate.

In the specific context of the FLI and SLI structures described in reference to FIGS. 1A-1C, copper (Cu) or solder employed in the conventional interconnect packaging technology, which has high stiffness, is eliminated in favor of a composite interconnect material built up on one of more of the substrates to be joined by the interconnect. The interconnect structures described herein potentially offer a higher overall yield. With the ability to reduce joint stiffness and improve elasticity, joint failure modes will be reduced, such as, but not limited to: ILD cracking; SJR failures; and chip-attach non-contact opens. With a shift away from ball technology, failure modes particular to ball technology are eliminated, such as, but not limited to, ball attach and surface mount non-wets.

In embodiments, a functional composite interconnect structure entails a multi-layered laminated structure disposed on one or both substrates to be joined. FIGS. 2A, 2B, 2C, and 2D are cross-sectional views of a substrate with multi-layered interconnect stacks, in accordance with embodiments. Generally, the embodiments exemplified by the FIGS. 2A-2D may be combined within a single package and indeed within a single interconnect level. Therefore, each specific interconnect structure illustrated is to be considered exemplary atomic element.

Figure 2A:
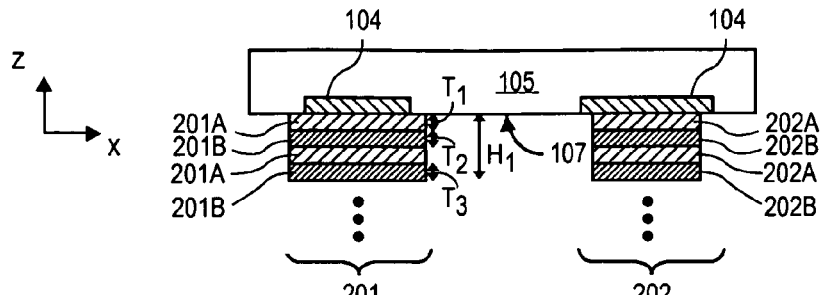
FIGS. 2A, 2B, 2C, and 2D are cross-sectional views of a substrate with multi-layered interconnect stacks, in accordance with embodiments.

As shown in FIG. 2A, a first multi-layered interconnect stack 201 is disposed on a substrate 105 with top level interconnect pads 104 exposed for package-level interconnection. Disposed between the top level interconnect pads 104 is a dielectric material 107, which generally functions as an electrical insulator, hermetic seal, etc. and may be any material commonly employed in the art for this purpose. In a first embodiment, the substrate 105 may entail any integrated electronic device, such as, but not limited to, an IC, a MEMs, an OIC or a photonic IC (PIC). Exemplary ICs include application specific ICs (ASICs), volatile memories, non-volatile memories (e.g., flash or phase change memory), and microprocessors. With many of the stress-related issues addressed by embodiments described herein, in particularly advantageous implementations, the substrate 105 is a large-area IC, such as a microprocessor. With the embodiments herein capable of nanometer level control of interconnect structure z-height, particularly advantageous embodiments include chip-to-chip bonding (e.g., memory chip to microprocessor) where minimal z-height is particularly beneficial. In a second embodiment, the substrate 105 is any package substrate or interposer. In a third embodiment, the substrate 105 is a PCB.

Figure 2B:
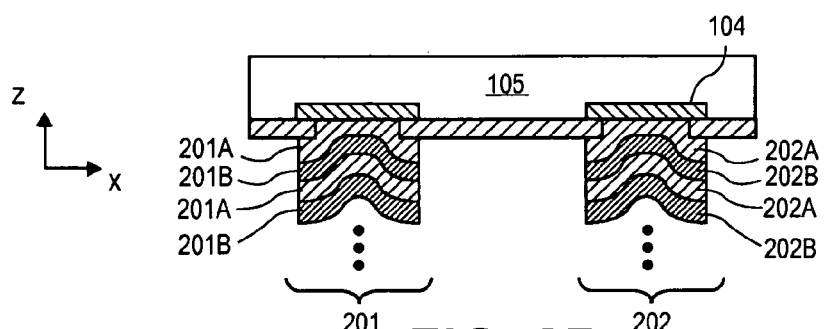

The multi-layered interconnect stack 201 is generally disposed over a top level interconnect pad 104 and is electrically coupled to the pad 105. The multi-layered interconnect stack 201 forms a protrusion extending from the dielectric material 107 a distance or z-height ($H_1$) that is sufficient to make first contact with a second substrate (not depicted). While $H_1$ is a function of whether the interconnect stack 201 is to serve as a FLI or SLI and is further expected to scale with each packaging generation, an exemplary range is 10-80 μm (micron). With a top surface of the interconnect stack 201 to serve as a point of first contact with a second substrate (i.e., in absence of an intermediary, such as a ball), the multi-layered interconnect stack 201 is not an under bump metallization (UBM), but rather is the basis for the bulk package-level mechanical and/or electrical joint to a second substrate. As further illustrated in FIG. 2A by a second multi-layered interconnect stack 202, the interconnect stacks described herein may either have an area smaller than or larger than that of the top level interconnect pad 104. Similarly, the substrate surface upon which the interconnect stack is disposed may either be a metal defined surface, as shown in FIG. 2A, or a dielectric defined surface, as shown in FIG. 2B. While a ball-based technology is typically limited to dielectric-defined surfaces (forming a recess into which a ball is held), the interconnect embodiments described herein are not so limited with respect to the substrate surface or interconnect pad area.

In embodiments, a multi-layered interconnect stack includes layers of at least two distinct materials. As illustrated in FIG. 2A, the first multi-layered interconnect stack 201 includes a layer 201A disposed directly on the top level interconnect pad 104 and a layer 201B disposed directly on the layer 201A. The layer 201A is of a different material than is the layer 201B. In the exemplary embodiment, the two distinct materials in layers 201A and 201B are to form a composite interconnect joint having the desired function for the particular interconnect provided by the interconnect stack 201.

Generally, each of the layers 201A and 201B may be any of a metal, a ceramic, or polymer, as dependent on the electrical and/or mechanical function of the interconnect. For example, where only a structural joint is needed, a ceramic or polymer may be used and where electrical or thermal joint is required, the materials may be metals. Upon bonding with a second substrate, beyond undergoing a threshold level of deformation during reflow needed for continuity/void filling, the interconnect stack 201 may maintain the as-deposited laminate structure illustrated in FIG. 2A, or may intermix, as a function of the materials in layers 201A and 201B. In one metallic embodiment for example, the multiple layers 201A and 201B are selected to form an alloy upon reflow, whereby the various elements in the material of layer 201A and the various elements in the material of layer 201B substitute randomly for one another to form a solid solution with a range of possible compositions between the as-deposited states of layers 201A and 201B. In another metallic material embodiment, the multiple layers 201A and 201B are selected to form an intermetallic upon reflow, whereby the various elements in the material of layer 201A and the various elements in the material of layer 201B are ordered into different sites to form a homogeneous microstructure having a range of order extending at least the thickness of both the layers 201A and 201B.

Each of the layers 201A and 201B may have a thickness ($T_1$, $T_2$, respectively) that is predetermined based on the as-deposited composition of the layers 201A, 201B and on the as-reflowed composite composition of the interconnect joint to be formed from the interconnect stack 201. For example, if a laminate structure is desired in the final composite interconnect joint, the layer thicknesses $T_1$, $T_2$ are sufficient to preclude complete intermixing of the layers by either solid or liquid state diffusion. In the exemplary embodiment however, where an intermetallic having a homogeneous microstructure spanning at least across a thickness equal to the sum of $T_1$ and $T_2$ (and may further span approximately the thickness of a joint in some embodiments), the layer thicknesses $T_1$, $T_2$ are sufficiently thin to completely intermix. As such, the layers thicknesses may be in the nm (nanometer) range (e.g., 50-75 nm) up into the micron (micrometer) range. This ability to define the thickness $T_1$ and $T_2$ may therefore achieve a desired bulk microstructure that may be difficult, or impossible, to achieve otherwise.

In one specific embodiment, layers 201A and 201B are to provide a joint of $Ag_3Sn$. In one such embodiment, layers (e.g., 201A) of Ag, having a thickness in the nanometer range, alternates with layers (e.g., 201B) of Sn, also having a thickness in the nanometer range, with relative thickness $T_1$ and $T_2$ selected to generate $Ag_3Sn$ as an intermetallic compound forming the bulk (i.e., more than an interface) of an interconnect joint. In another specific embodiment, layers 201A and 201B are to similarly provide an intermetallic joint of $CeSn_3$ (e.g., layer 201A being Ce and layer 201B being Sn of appropriate thickness). In either embodiment, the layer may consist essentially of their respective elements with trace impurities permitted to the extent the impurity does not eliminate all the benefits identified for these intermetallic compounds. For example, it has been found that intermetallic compounds of $Ag_3Sn$ $CeSn_3$ have a Young's modulus 30-50% smaller than that of Cu and most Cu intermetallics. Thus, joints formed from the interconnect stack embodiments described herein may have reduced stiffness for reduced ILD cracking a fewer SJR failures. Furthermore, $Ag_3Sn$ intermetallic has an electrical resistance that is more than three times less than that of $Cu_6Sn_5$ employed in conventional copper balls, and more than six times less than that of conventional SAC (Sn—Ag—Cu) solder. Joints formed from the interconnect stack embodiments described herein may therefore also have improved electrical characteristics (e.g., lower resistance, reduced Joule heating, etc.).

In embodiments, the interconnect stack 201 includes a plurality layers 201A of the first material and a plurality of layers 201B of the second material. As shown in FIG. 2A, the plurality of first material layers 201A alternate or interleave within the plurality of second material layers 201. This repeating laminate structure enables the interconnect stack 201 height $H_1$ provide a desired standoff from the substrate 105 while permitting the individual layer thicknesses $T_1$ and $T_2$ to varying independently as needed to achieve the desired microstructure or composition within the composite interconnect joint formed.

Figure 2C:
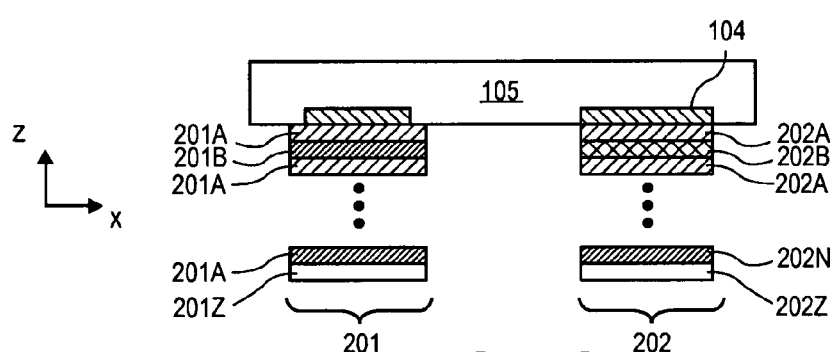

In further embodiments, the repeating laminate structure is utilized to vary the composition of the interconnect between opposite ends of an interconnect structure, for example to tailor material properties of a resulting interconnect joint specific to the characteristics of the substrates joined. In this manner a variety of surface finishes, CTE, or other characteristics for substrates received from different supply chains or for different applications may be accommodated by the interconnect stack 201. FIG. 2C illustrates one exemplary embodiment where a repeating unit proximate to a first end of a laminate structure includes materials 201A and 201B until a third material 201Z is introduced proximate to a second end of the structure. While the exemplary third material 201Z may be to accommodate a certain surface finish, the third material 201Z may alternatively be introduced as part of a second repeating unit, for example interleaving with 201A, within a top portion of the stack 201. In another embodiment, a thickness of at least one of the first material layers or second material layers is different between repetitions of the material layer to vary the composition of a multi-layered stack even where only two materials are employed. For example, the layer 201B in FIG. 2A may first have the layer thickness $T_2$ proximate to a first end of the interconnect stack and then have a second layer thickness $T_3$ that is different the $T_2$ proximate to a second end of the interconnect stack. Where each successive layer 201A, for example is a different thickness, a resulting composite joint may be of a continuously varied (i.e., graded) alloy composition.

In embodiments, a plurality of interconnect stacks is provided across a bonding face of a substrate. As further shown in FIG. 2A, the substrate 105 includes the second multi-layered interconnect stack 202 disposed over a second top level interconnect pad 104. The second multi-layered interconnect stack 202 forms a protrusion also extending the z-height $H_1$, to be substantially equal to that of the first multi-layered interconnect stack 201. In the embodiments illustrated by FIGS. 2A and 2B, the composition and thickness of each material layer 202A, 202B is the same as the layers 201A, 201B, respectively, such that the second interconnect stack 202 is a replication of the interconnect stack 201.

In embodiments, composition varies across a plurality of interconnect stacks. In this manner the composite interconnect joint formed is functionalized to the level of individual interconnects. For such embodiments, at least a second interconnect stack includes at least one material layer distinct from those in a first multi-layered interconnect stack. For example, as illustrated by the distinct field lines in FIG. 2C, the composition of layer 202B is distinct from that of layer 201B. As such, while the layers 201A and 202A are the same, the second layer (201B) disposed directly on the layer 201A varies between the interconnect stacks 201 and 202. Therefore, where a repeating laminate structure is provided by successively alternating between two or more materials, the repeating unit is distinct between adjacent interconnect stacks 201 and 202.

Figure 2D:
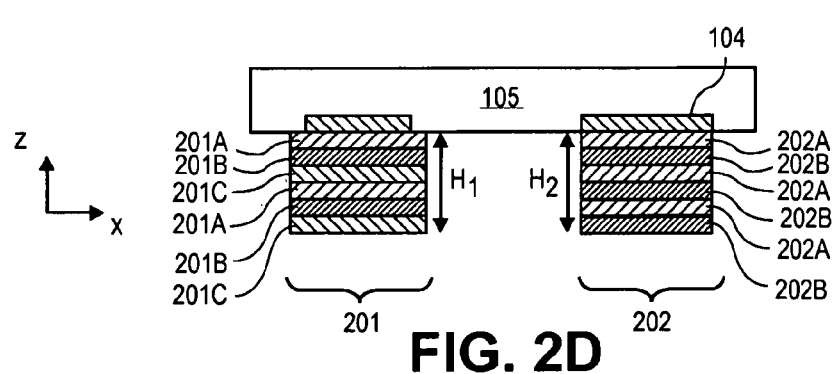

In further embodiments, compositional variation between adjacent interconnect is provided even where all the material layers of a first interconnect stack are also present in the second interconnect stack by further including additional material layers in one of the stacks. For example, as further illustrated by FIG. 2D, the first interconnect stack 201 includes layers 201A, 201B, that are the same materials as the layers 202A, 202B in the second interconnect stack 202. However, the first interconnect stack 201 further includes a third material layer 201C. More complex material system can thereby be provided with additional compositional layers. For example, where the stacks 201 and 202 are to form alloys during a bonding process, the stack 201 may form a ternary alloy joint while the stack 202 may form a binary alloy joint. As also shown in FIG. 2D, for embodiments where the interconnect stack 201 includes at least one material layer distinct from those in the second interconnect stack 202, the stack thicknesses may be nonetheless approximately equal (e.g., $H_1 = H_2$).

Figure 3A:
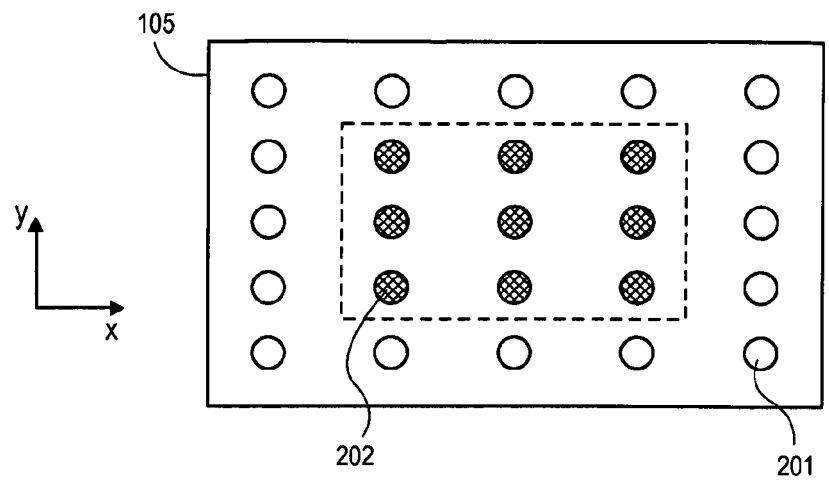
FIG. 3A is a plan view of interconnects with functional variation between regions of a substrate, in accordance with an embodiment.

In addition to facilitating novel interconnect materials, such materials, or indeed any conventional interconnect alloy, may be provided with the additional ability to functionalize the alloy at the individual interconnect level. For any of the embodiments where interconnect structures are varied across an area of the substrate 105, such variation may be based, at least in part, on the physical location of the specific interconnect. FIG. 3A is a plan view of interconnects with functional compositions, in accordance with one such embodiment. As shown, interconnect stacks 201 located proximate to a perimeter of the first substrate 105 may all have a functional interconnect composition distinct from the interconnect stacks 202 located proximate to a center of the substrate 105. Such spatial variation may be provided either through independent manipulation of layer properties within a multi-layered stack, or through independent manipulation of a single homogenous material layer. As one example, the first interconnect stacks 201 may be designed to render an interconnect joint having greater ductility, or lower conductivity, or both, than does a second interconnect joint resulting from the interconnect stacks 202. Greater ductility for interconnect close to an edge of a package are functionalized to improve shock resistance while the interconnects toward the center of a package are functionalized to improve electrical performance. For example, Ag content of an interconnect structure may be varied between center and edge populations. Generally, lower Ag content renders an interconnect joint more compliant. As one specific embodiment, a Cu/SAC105+Ni interconnect structure is provided at perimeter or edge regions (e.g., structures 201 in FIG. 3A) for shock performance while a Ni/SAC405 interconnect structure is provided proximate to a substrate center (e.g., structures 202 in FIG. 3A) for better thermal cycle fatigue performance.

Figure 3B:
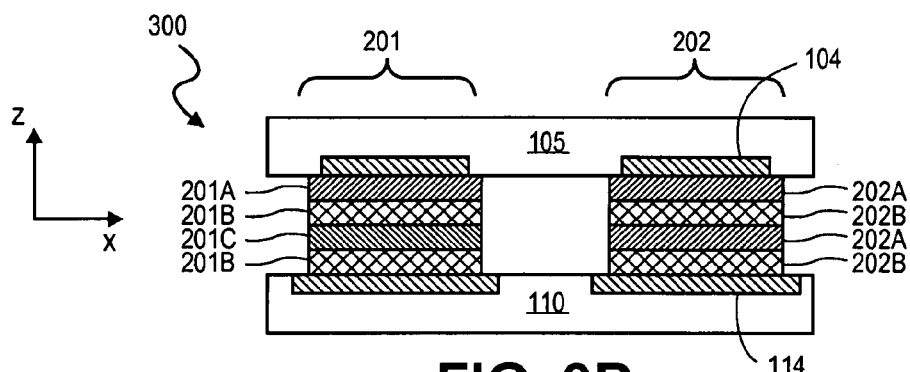
FIG. 3B is a cross-sectional view of a package assembly with multi-layered interconnect stacks, in accordance with an embodiment.

FIG. 3B is a cross-sectional view of a package assembly 300 with multi-layered interconnect stacks 201 and 202 making contact to the top level pads 104 and 114 prior to a reflow of the interconnect stacks 201 and 202. Generally, the second substrate 110 may be any of the exemplary embodiments described elsewhere herein for the substrate 105. For example, the assembly 300 may be a FLI where the substrates 105 and 110 are both ICs, the assembly 300 entails a stacked ICs (i.e., a 3DIC structure). Where the substrate 110 is a package substrate and the substrate 105 is an IC or a package substrate, the assembly 300 entails a packaged integrated device. Where the substrate 110 is a PCB, the assembly 300 entails a direct chip attached assembly if the substrate 105 is an IC or a SLI where the substrate 105 is a package substrate. In one specific embodiment, the substrate 105 is a memory IC, and the substrate 110 is a microprocessor.

In the context of a Cu/SAC105+Ni and Ni/SAC405 embodiment, the stack 201 may include a first layer 201A of Cu, a second layer 202A of SAC105, and a third layer 201C of Ni, while the stack 202 may include a first layer 202A of Ni, and a second layer 202B of SAC405, for example.

Figure 3C:
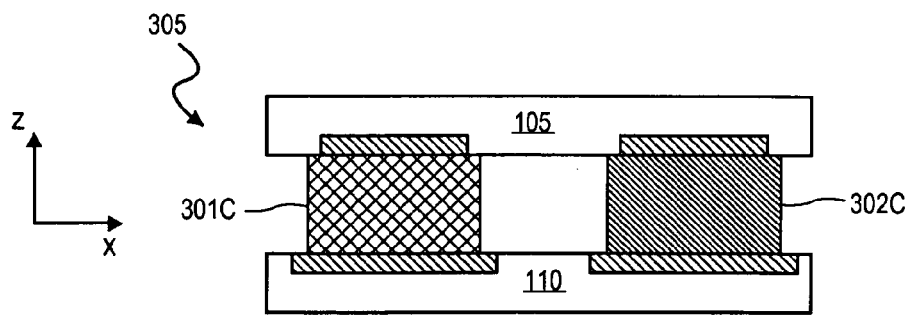
FIG. 3C is a cross-sectional view of the package assembly illustrated in FIG. 3B with functionally alloyed interconnects, in accordance with an embodiment.

FIG. 3C is a cross-sectional view of the package assembly illustrated in FIG. 3B with composite interconnect 301C and 302C representative of an embodiment after a multi-layered stack structure, such as illustrated in FIG. 3B is reflowed or where a composite material was deposited as a single homogeneous film, for example by co-sputtering. As previously described, for multi-layered stack embodiments, the composite interconnect formed is a function of the material system and thicknesses of the material layers. In the more specific context of a multi-layered metal stack; where the composite interconnect is a mixture, the mixture may be in the form of either an alloy, or intermetallic compound.

For embodiments where the composite interconnect compositions are functionalized within a substrate (e.g., as in the context of a Cu/SAC105+Ni and NUSAC405 embodiment), the composite interconnect 301C is first intermetallic compound (e.g., Cu—Ni—Sn) while the composite interconnect joint 302C is a second, distinct, intermetallic compound (e.g., Cu—Ni—Sn). In one exemplary embodiment where the substrate 105 is a memory IC and the substrate 110 is a microprocessor IC, the composite interconnect is an intermetallic compound having homogeneous microstructure over the entire distance between the interconnect pads 104 and 114.

Figure 4A:
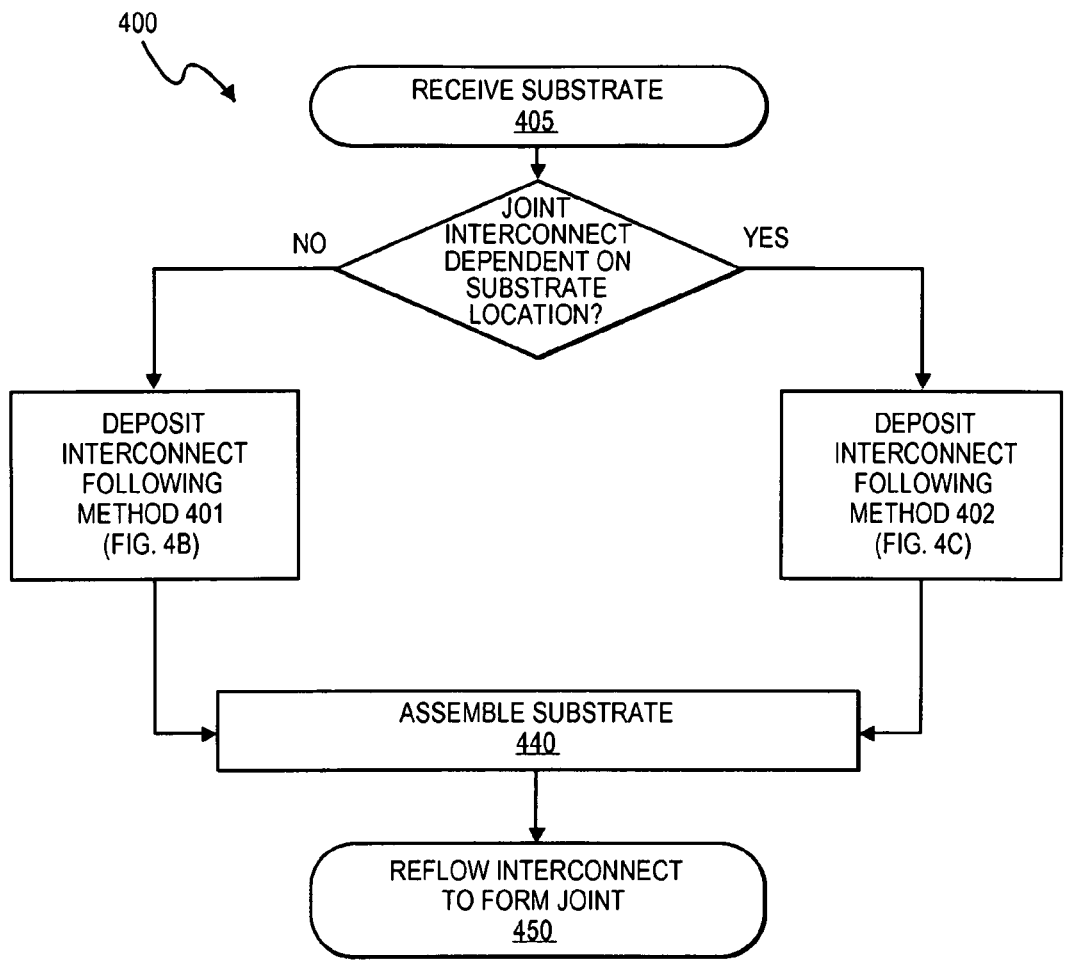
FIGS. 4A, 4B, and 4C are flow diagrams illustrating methods of forming interconnects, in accordance with embodiments.
Figure 4B:
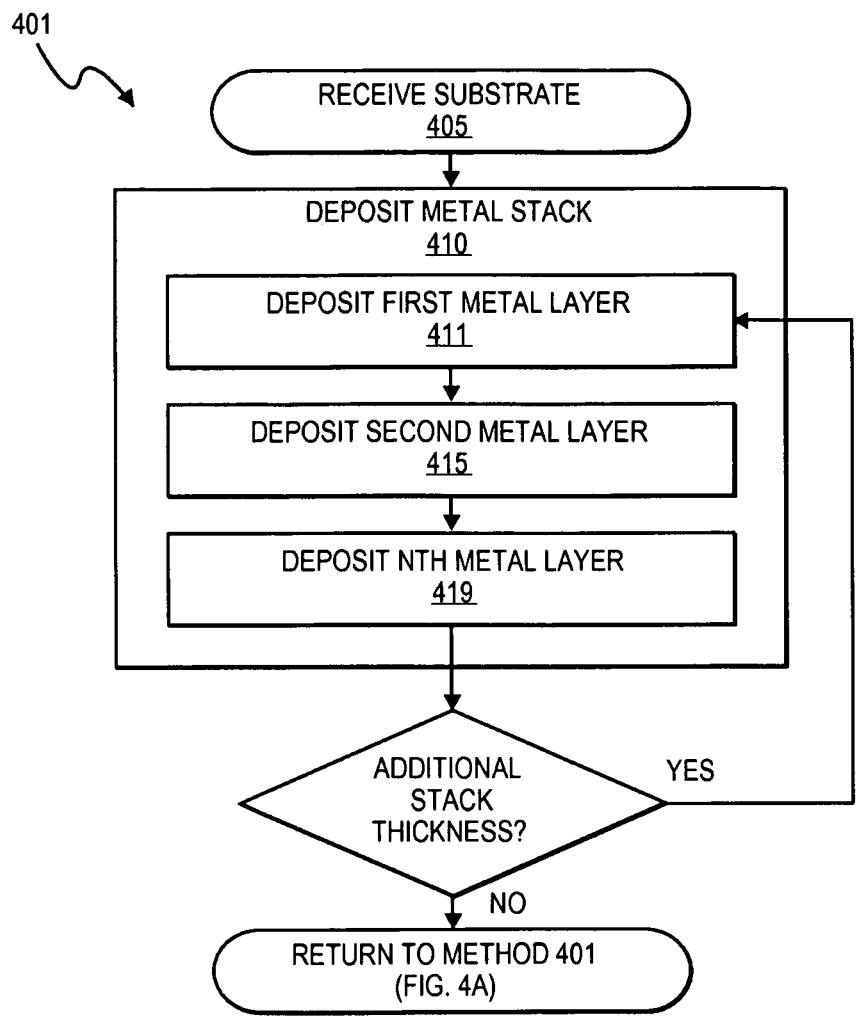
Figure 4C:
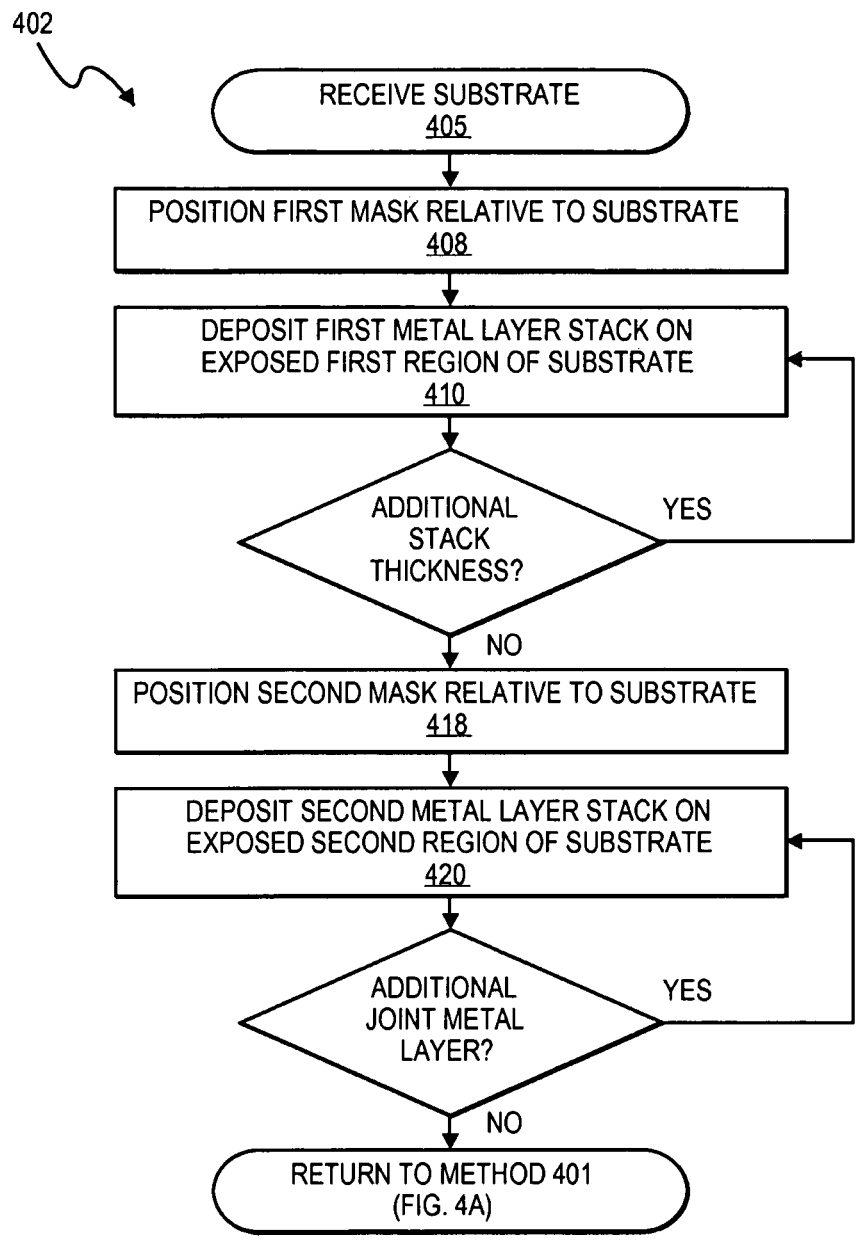
Figure 5:
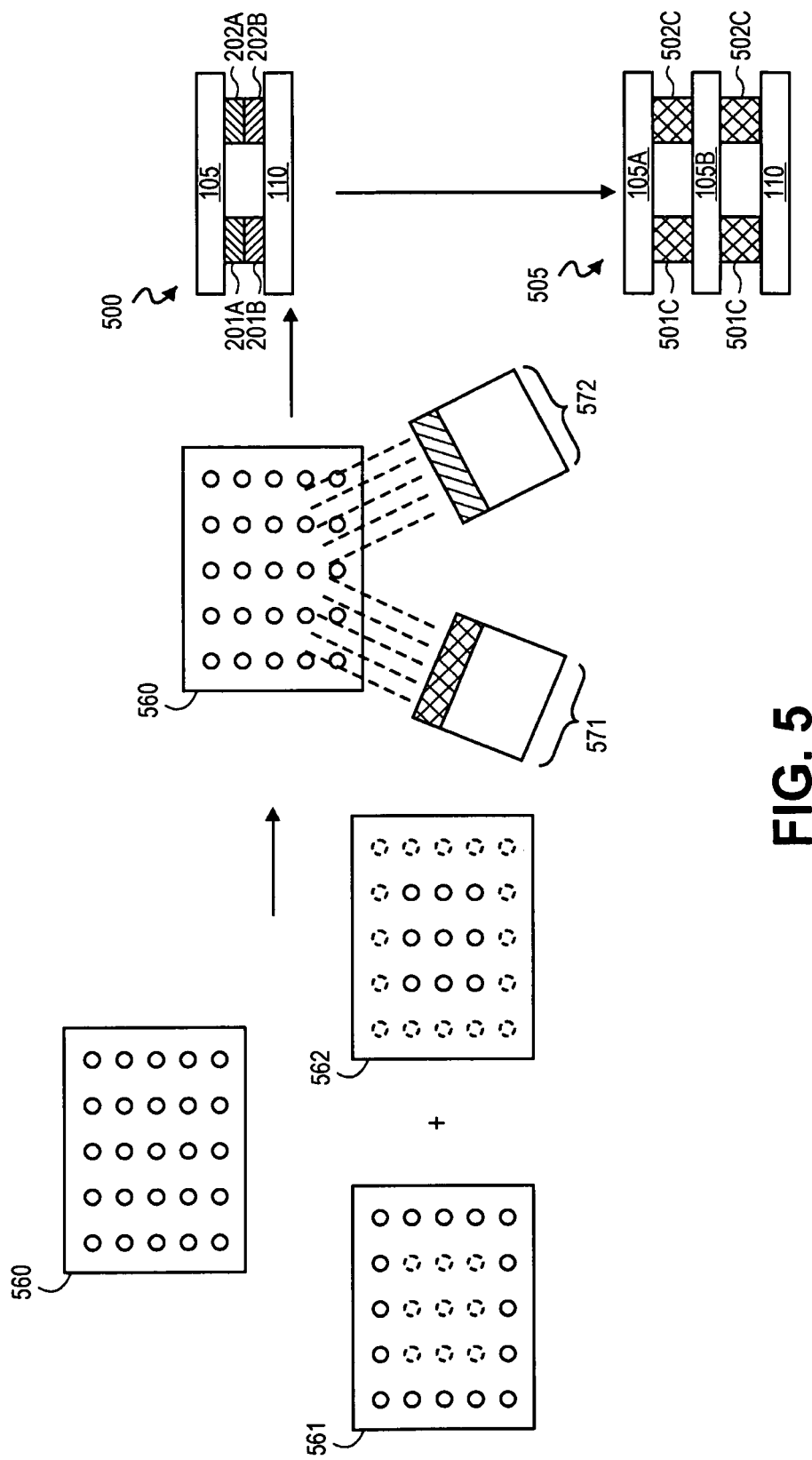
FIG. 5 is a schematic representation of the method of forming interconnects illustrated in FIGS. 4A-4C, in accordance with embodiments.

FIGS. 4A, 4B, 4C are flow diagrams illustrating methods of forming interconnects, in accordance with embodiments. FIG. 5 is a schematic representation of the method of forming interconnects illustrated in FIGS. 4A-4C, in accordance with particular embodiments.

Referring first to FIG. 4A, method 400 begins with receiving a substrate at operation 405. For example, an assembler may receive a wafer including a plurality of ICs, with each IC having a plurality of top level interconnect pads exposed and with a predetermined surface finish. The method 400 proceeds from operation 405 in a manner dependent on whether the interconnect joint is to be dependent on location within the substrate (e.g., within an IC die on a wafer). If not, method 401 includes a same deposition or serial deposition sequence for all interconnects on a substrate which is exemplified for a multi-layered stack following the method 401 illustrated in FIG. 4B. If interconnect joints are functionalized within a substrate, method 400 proceeds with a plurality of masked deposition following the method 402 further illustrated in FIG. 4C. For either embodiment, once the interconnect structure is formed, the substrate so prepared follows a specific chip attach or other processing route at operation 440 to assemble the substrate onto a second substrate. At operation 450, the interconnect is reflowed, for example with any conventional technique using either a flux technology or fluxless technology, such as in a forming gas environment, etc. A die-to-die, die-to-board, package-to-package, or package to board assembly is then substantially complete.

Method 401, as illustrated by FIG. 4B, is for an exemplary interconnect stack comprising metal system, though an analogous method may be applied in the context of other materials (e.g., ceramics). The method 401 begins with receiving a substrate 405 with exposed top level interconnect pads, substantially as described elsewhere herein for substrate 105. The method 401 then proceeds to build up a multi-layered metal stack upon one or more of the exposed pads at operation 410. In one embodiment of operation 410, a first metal layer is deposited directly on the substrate at operation 411, a second metal layer of different composition is deposited at operation 415. Additional deposition operations may be further included, for example, depositing an Nth metal layer at operation 419. Operation 410 is repeated by iterating each of the operations 411, 415 and 419 serially until a predetermined stack thickness is achieved.

While the any deposition technique known in the art as being applicable for the particular material layer to be formed may be utilized, in one embodiment the deposition operations 411, 415 and 419 are performed with a physical vapor deposition (PVD) process, such as, but not limited to, a magnetron sputtering system employing DC or RF, as a function of the material to be sputtered. Single or multi-target sputtering systems configured for co-sputtering may be utilized for each of the layers. For example, with co-sputtering performed to arrive at a single layer composition not achievable with a single target. A different target, or targets in the case of co-sputtering of a single layer, may be utilized between layers of a multi-layered stack. For example, a co-sputtering system may utilize separate targets serially to form separate layers of a stack. Of course, where an interconnect is to consist only of a single homogeneous layer, only one of the deposition operations 411, 415, 491 is performed.

In embodiments, prior to a first iteration of operation 410, a pre-sputtering is performed to remove oxide or contaminants from the target and/or interconnect pads. In further embodiments, a substrate is rotated during deposition to improve thickness uniformity of the first, second, and Nth layers. For embodiments where layer thickness vary, deposition time or rate may be varied for one or more of operations 411, 415 or 419 between successive iterations of operation 410 to modify a composition of an interconnect structure along a longitudinal length, or z-height of the structure.

In embodiments, one or more of the deposition operations 411, 415, 419 are performed with a mask, such as a masking stencil to shadow portions of the substrate. In one such embodiment, further illustrated by FIG. 5, the masking stencil 560 exposes every interconnect pad on a substrate to every deposition performed as part of operation 410. For example, sputter target 571 deposits a first layer 201A directly on the substrate 105 through the mask stencil 560. Subsequently, sputter target 572 deposits a second layer 201B directly on the layer 201A. As such, the masking stencil is a means to selectively form discrete interconnect stacks in an additive manner (preferred where subtractive etching is difficult for a particular material system). Method 401 then returns to method 400 (FIG. 4A) with assembly operation 440, for example to form the assembly 500 illustrated in FIG. 5. Following assembly, reflow operation 450 (FIG. 4A) may convert the multi-layered interconnect stack into composite interconnect joints 501C, 502C (FIG. 5), for example by alloying the multiple material layers together or by forming an intermetallic compound. The methods 400 and 401 can further be repeated to stack-up a plurality of substrates as shown in FIG. 5, as may be done with TSV technology, for example.

In embodiments, a plurality of masking stencils is employed to selectively form interconnect stacks of differing composition across a substrate. FIG. 4C illustrates the exemplary method 402 where a first masking stencil is positioned relative to a substrate at operation 408. While the method 402 illustrates an exemplary embodiment where a multi-layered metal stack is formed, the method is of course applicable where a single homogeneous layer is to be deposited. At operation 401, a first metal stack is deposited on an exposed first region of the substrate at operation 410. For example, a sputter deposition process may be performed to deposit a stack of material layers in regions not shadowed by the first stencil mask. The operation 410 is iterated until a desired stack thickness is achieved.

At operation 418, a second stencil mask is positioned relative to the substrate. The second stencil mask has a different arrangement of openings than does the first stencil mask. For example, the first and second stencils may expose mutually exclusive ones of top interconnect pads on the substrate (i.e., second stencil mask having an opening aligned with the second top level interconnect pads and shadowing the first top level interconnect pads and vice versa). As further shown in FIG. 5 for example, a first mask 561 includes openings around a perimeter of substrate unit (e.g., IC die) while a second mask 562 includes opening proximate to a center of the substrate unit. Returning to FIG. 4C, with the second mask in position, a second metal layer stack is deposited on the exposed second region of the substrate at operation 420. The operation 420 is iterated serially through successive sputter depositions with any number of desired target materials until a desired thickness is achieved, for example a thickness substantially the same as that of the first metal layer stack. The method 402 then returns to method 401 (FIG. 4A) for assembly operation 420 and reflow operation 450. With at least two different interconnect stacks having been made across the surface of the substrate, subsequent to the reflow operation 450, a first intermetallic compound (e.g., including at least first and second materials) is formed within the first interconnect joint while a second intermetallic compound (e.g., including at least third and fourth materials where at least one of the third and fourth materials is distinct from the first and second materials) is formed within the second interconnect joint.

Figure 6:
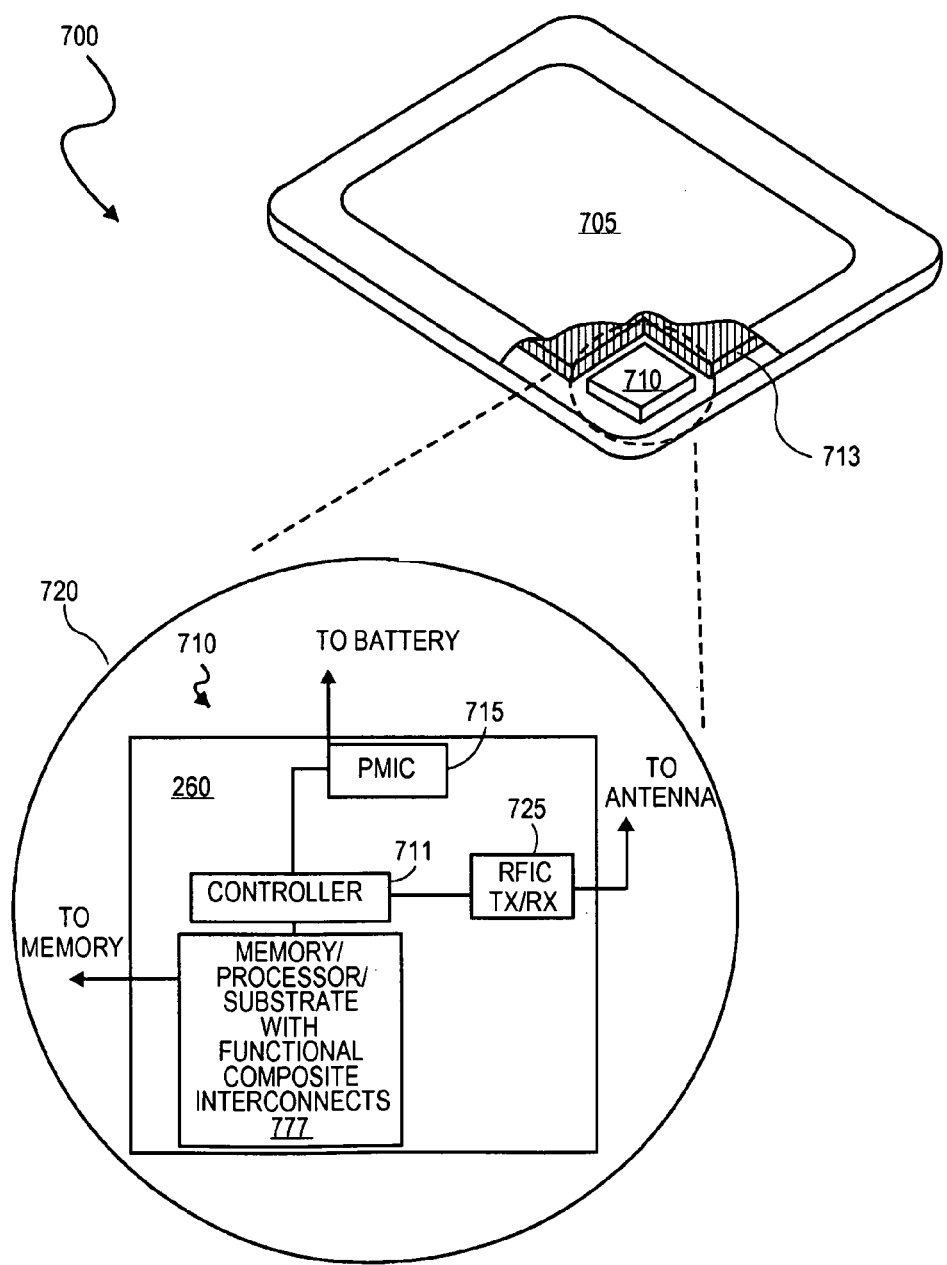
FIG. 6 is a functional block diagram of a mobile computing platform 700 which employs functionally alloyed and/or multi-layered interconnects, in accordance with an embodiment of the present invention.

FIG. 6 is a functional block diagram of a mobile computing platform 700 which employs the assembly 305 (FIG. 3C) or assembly 505 (FIG. 5) in accordance with embodiments of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), the board-level integrated system 710, and a battery 713. As illustrated, the greater the level of integration of the board-level integrated system 710, the greater the portion of the mobile computing platform 700 that may be occupied by the battery 713 or non-volatile storage, such as a solid state drive, for greatest platform functionality. As such, the ability to stack a memory chip directly on a processor chip package with a minimal z-height using the composite interconnect stacks as described herein, enables further performance and form factor improvements of the mobile computing platform 700. Furthermore, because the functionalized compositions of the interconnects may be performed at the individual interconnect level, improved shock resistance of the mobile computing platform 700 may also be achieved.

The board-level integrated system 710 is further illustrated in the expanded view 720. In the exemplary embodiment, the stacked-package assembly 777 includes at least one memory chip (e.g., RAM), at least one processor chip (e.g., a multi-core microprocessor and/or graphics processor), and a composite interconnect disposed there between joining the two. The assembly 777 is further coupled to the board 260, for example through a package substrate, which may further include one or more of the functional composite interconnects described herein. Depending on the embodiment, in addition to the stacked-package assembly 300, one or more of a power management integrated circuit (PMIC) 715, RF integrated circuit (RFIC) 725 including an RF transmitter and/or receiver, a controller thereof 711, is on a PCB 260. Functionally, the PMIC 715 performs battery power regulation, DC-to-DC conversion, etc., and so has an input coupled to the battery 713 and with an output providing a current supply to all the other functional modules, including the stacked-package assembly 305. As further illustrated, in the exemplary embodiment the RFIC 725 has an output coupled to an antenna to provide a carrier frequency of around 2 GHz (e.g., a 1.9 GHz in an RFIC 725 designed for 3G or GSM cellular communication) and may further have an input coupled to communication modules on the board-level integrated system 710, such as an RF analog and digital baseband module (not depicted).

The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The platform 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An integrated electronic device, comprising:
   a first substrate with top level interconnect pads and a dielectric material disposed between the pads; and
   a first multi-layered interconnect stack disposed over a first top level interconnect pad and electrically coupled to the pad, wherein the first multi-layered interconnect stack forms a protrusion extending from the dielectric material a distance sufficient to make first contact with a second substrate, wherein the first multi-layered interconnect stack comprises a first layer of a first material and a second leer of a second material different than the first material, wherein the first material consists essentially of Sn and than second material consists essentially of Ag or comprises Ce, and wherein the first and second layers are reflowable into a composite interconnect joint.

2. The integrated electronic device of claim 1, wherein the first multi-layered interconnect stack comprises a repeating laminate structure including a plurality layers of the first material and a plurality of layers of the second material, the plurality of first and second material layers alternating throughout the thickness of the first multi-layered interconnect stack.

3. The integrated electronic device of claim 2, wherein a thickness of at least one of the first material or second material is different between repetitions to vary the composition of the first multi-layered stack across a thickness of the stack.

4. The integrated electronic device of claim 1, further comprising:
   a second multi-layered interconnect stack disposed over a second top level interconnect pad, the second mufti-layered interconnect stack forming a protrusion extending from the dielectric material a distance substantially equal to that of the first multi-layered interconnect stack, and including at least one material layer distinct from those in the first multi-layered interconnect stack.

5. An integrated electronic device assembly, comprising:
   the first substrate of claim 1;
   a second substrate having a conductive pad joined to the first top level interconnect pad by a first interconnect including the first and second materials.

6. The assembly of claim 5, wherein the first material consists essentially of Sn and wherein the second material comprises Ag or Ce, and wherein the first interconnect comprises $Ag_3Sn$ or $CeSn_3$.

7. The integrated electronic device of claim 5, wherein the first top level interconnect pad is disposed at a perimeter of the first substrate and wherein the first interconnect has greater ductility or lower conductivity than a second interconnect coupling the second substrate to a second top level interconnect pad disposed at a center of the first substrate.

8. The integrated electronic device of claim 6, wherein both the first and the second interconnects comprise at least Sn, Ag, and Cu wherein the second interconnect has a higher Ag content than the first interconnect.

9. An integrated electronic device assembly, comprising:
   a first substrate and a second substrate each with top level interconnect pads and a dielectric material disposed between the pads;
   a first interconnect joining the first and second substrates at a first of the top level interconnect pads; and
   a second interconnect joining the first and second substrates at a second of the top level interconnect pads, wherein the first and second interconnects comprise different materials.

10. The integrated electronic device assembly of claim 9, wherein at least one of the first and second interconnects comprises $Ag_3Sn$ or $CeSn_3$.

11. The integrated electronic device assembly of claim 9, wherein the first interconnect has greater ductility or lower conductivity than the second interconnect.

12. A microprocessor package assembly comprising:
    a microprocessor chip with first top level interconnect pads and a dielectric material disposed there between;
    a memory chip with second top level interconnect pads and a dielectric material disposed there between; and
    an intermetallic joint coupling the first and second top level interconnect pads, the intermetallic joint having a homogenous composition across a distance between the first and second top level interconnect pads.

13. The microprocessor package assembly of claim 12, wherein the intermetallic joint comprises $Ag_3Sn$ or $CeSn_3$.

14. A method of fabricating a package interconnect, the method comprising:
    receiving a first substrate with top level interconnect pads exposed and a dielectric material disposed between the pads;
    depositing a first multi-layered interconnect stack over a first top level interconnect pad, the first multi-layered interconnect stack forming a protrusion extending from the dielectric material a distance sufficient to make first contact with a second substrate, and the first multi-layered interconnect stack comprising layers of at least two distinct materials that are reflowable into a composite interconnect joint;
    joining the first substrate to a second substrate with the first multi-layered interconnect stack disposed between the substrates; and
    reflowing every layer of the first multi-layered interconnect stack to form a first interconnect joint between the first and second substrates.

15. The method of claim 14, wherein depositing the first multi-layered interconnect stack further comprises:

depositing a first material over the first top level interconnect pad;
depositing a second material over the first material; and
repeating the depositing of first and second materials in an alternating manner until the first multi-layered interconnect stack protrudes a predetermined distance from the substrate surface.

16. The method of claim 14, further comprising:
depositing a second multi-layered interconnect stack over a second top level interconnect pad, the second multi-layered interconnect stack forming a protrusion extending from the dielectric material a distance substantially equal to that of the first multi-layered interconnect stack, and including at least one material layer distinct from those in the first multi-layered interconnect stack.

17. The method of claim 16, wherein depositing the second multi-layered interconnect stack further comprises:
depositing a third material over the second top level interconnect pad;
depositing a fourth material over the first material; and
repeating the depositing of third and fourth materials in an alternating manner until the second multi-layered interconnect stack has the predetermined thickness.

18. The method of claim 16, wherein depositing the first and second materials further comprises DC or RF sputtering with a first stencil mask having an opening aligned with the first top level interconnect pad and shadowing the second top level interconnect pad, and wherein depositing the third and fourth materials further comprises DC or RF sputtering with a second stencil mask having an opening aligned with the second top level interconnect pad and shadowing the first top level interconnect pad.

19. The method of claim 14, wherein reflowing the first multi-layered interconnect stack forms a first intermetallic comprising the first and second materials within the first interconnect joint.

20. The method of claim 19, wherein the first intermetallic is selected from the group consisting of $Ag_3Sn$ and $CeSn_3$.

21. The method of claim 16, further comprising:
joining the first substrate to a second substrate with the first and second multi-layered interconnect stacks disposed between the substrates at different locations; and
reflowing the first and second multi-layered interconnect stack to form first and second interconnect joints between the first and second substrates, wherein reflowing the first multi-layered interconnect stack forms a first intermetallic comprising the first and second materials within the first interconnect joint and wherein reflowing the second multi-layered interconnect forms a second intermetallic comprising the third and fourth materials within the second interconnect joint, the first and second intermetallics having distinct compositions.

22. An integrated electronic device, comprising:
a first substrate with top level interconnect pads and a dielectric material disposed between the pads;
a first multi-layered interconnect stack disposed over a first top level interconnect pad and electrically coupled to the pad, wherein the first multi-layered interconnect stack forms a protrusion extending from the dielectric material a distance sufficient to make first contact with a second substrate, and wherein the first multi layered interconnect stack comprises layers of at least two distinct materials that are reflowable into a composite interconnect joint; and
a second multi-layered interconnect stack disposed over a second top level interconnect pad, the second multi-layered interconnect stack forming a protrusion extending from the dielectric material a distance substantially equal to that of the first multi-layered interconnect stack, and including at least one material layer distinct from those in the first multi-layered interconnect stack.

23. The integrated electronic device of claim 22, wherein the first multi-layered interconnect stack comprises a repeating laminate structure including a plurality layers of the first material and a plurality of layers of the second material, the plurality of first and second material layers alternating throughout the thickness of the first multi-layered interconnect stack.

24. The integrated electronic device of claim 23, wherein a thickness of at least one of the first material or second material is different between repetitions to vary the composition of the first multi-layered stack across a thickness of the stack.

25. An integrated electronic device assembly, comprising;
an integrated electronic device comprising a first substrate with, top level interconnect pads, a dielectric material disposed between the top level interconnect pads, and a first multi-layered interconnect stack disposed over a first top level interconnect pad and electrically coupled to the pad, wherein the first multi-layered interconnect stack forms a protrusion extending from the dielectric material a distance sufficient to make first contact with a second substrate, and wherein the first multi-layered interconnect stack comprises layers of at least two distinct materials that are reflowable into a composite interconnect joint; and
a second substrate having a conductive pad joined to the first top level interconnect pad by a first interconnect including the first and second materials, wherein the first top level interconnect pad is disposed at a perimeter of the first substrate and wherein the first interconnect has greater ductility or lower conductivity than a second interconnect coupling the second substrate to a second top level interconnect pad disposed at a center of the first substrate.

26. The integrated electronic device of claim 25, wherein both the first and the second interconnects comprise at least Sn, Ag, and Cu wherein the second interconnect has a higher Ag content than the first interconnect.

27. A method of fabricating a package interconnect, the method comprising:
receiving a first substrate with top level interconnect pads exposed and a dielectric material disposed between the pads;
depositing a first mufti-layered interconnect stack over a first top level interconnect pad, the first multi-layered interconnect stack forming a protrusion extending from the dielectric material a distance sufficient to make first contact with a second substrate, and the first multi-layered interconnect stack comprising layers of at least two distinct materials that are reflowable into a composite interconnect joint; and
depositing a second multi-layered interconnect stack over a second top level interconnect pad, the second multi-layered interconnect stack forming a protrusion extending from the dielectric material a distance substantially equal to that of the first multi-layered interconnect stack, and including at least one material layer distinct from those in the first multi-layered interconnect stack.

28. The method of claim 27, wherein depositing the second multi-layered interconnect stack further comprises:
depositing a third material over the second top level interconnect pad;

depositing a fourth material over the first material; and
repeating the depositing of third and fourth materials in an alternating manner until the second, multi-layered interconnect stack has the predetermined thickness.

29. The method of claim 27, wherein depositing the first and second materials further comprises DC or RF sputtering with a first stencil mask having an opening aligned with the first top level interconnect pad and shadowing the second top level interconnect pad, and wherein depositing the third and fourth materials further comprises DC or RF sputtering with a second stencil mask having an opening aligned with the second top level interconnect pad and shadowing the first top level interconnect pad.

30. The method of claim 27, further comprising:
joining the first substrate to a second substrate with the first and second multi-layered interconnect stacks disposed between the substrates at different locations; and
reflowing the first and second multi-layered interconnect stack to form first and second interconnect joints between the first and second substrates, wherein reflowing the first multi layered interconnect stack forms a first intermetallic comprising the first and second materials within the first interconnect joint and wherein reflowing the second multi-layered interconnect forms a second intermetallic comprising the third and fourth materials within the second interconnect joint, the first and second intermetallics having distinct compositions.

\* \* \* \* \*